United States Patent Office 3,305,416
Patented Feb. 21, 1967

3,305,416

METHOD FOR MAKING PRINTED CIRCUITS

George J. Kahan, Port Washington, and John L. Mees, Baldwin Place, N.Y., assignors to International Business Machines Corporation, New York, N.Y., a corporation of New York No Drawing. Filed Dec. 30, 1963, Ser. No. 334,623
3 Claims. (Cl. 156—3)

The present invention relates to a method for preparing laminated structures. More specifically, the invention is directed to improve methods for laminating electrically conductive materials to insulating films or sheets to produce structures having particular utility as "printed circuits" and the like. The invention is further concerned with a method for producing bubble-free "printed circuit" laminates for use in cryogenic devices.

It is common, in the manufacture of many electrical and electronic devices today, to use "printed circuits" in place of conventional hand-wired circuits. The term "printed circuits" generally refers to circuits comprising a pattern of conductive metal laminated to an insulating substrate and defining the path of an electrical circuit.

Conventional methods for producing "printed circuits" generally comprise laminating a thin film of a conducting metal to an insulating base or substrate. The lamination is usually accomplished by bonding the metal to the substrate by means of an adhesive material.

The metal surface of the laminated structure is coated with a resist or masking material in a pattern corresponding to the desired circuit pattern. Unmasked portions of the metal are then removed by etching. Finally, the "printed circuit" is incorporated in the overall device by soldering to it the necessary leads and contacts.

Unfortunately, "printed circuits" produced by conventional techniques have not been found to be entirely satisfactory for a number of reasons. First, the bond between the insulating substrate and the conductive metal film has been found to be defective in that voids or bubbles produced by entrapped air or other gases are present. During the etching step, the etchant fluid finds its way into the voids or bubbles and produces a conductive pattern having dimensions different from the dimensions defined by the resist pattern. Alteration of the dimensions in turn results in alteration of the electrical characteristics of the pattern.

In addition, if such circuits are incorporated into cyrogenic devices and are immersed in a liquid refrigerant, such as liquid helium, the refrigerant may creep into the voids or bubbles between the conductive pattern and the insulating base. Then, upon being removed from the coolant and brought to room temperature, the liquid coolant rapidly expands, sometimes causing fracture or loosening of the metal layer.

It has also been found to be extremely difficult to produce good adhesion between thin metal foils and plastic films, especially where the metal is a thin foil of one of the soft metals, such as high purity lead or tin, which are frequently used in cyrogenic devices for their superconducting properties.

An object of the present invention, therefore, is to produce laminated structures comprising bonded insulating and electrically conductive layers which are free from bubbles or air spaces between the layers and which are especially useful as "printed circuits" in cyrogenic devices.

Another object of the invention is to provide laminated structures characterized by improved adhesion between the adjacent layers.

A further object of the invention is to produce improved "printed circuits" which are bubble free and which exhibit improved adhesion between conducting and dielectric layers.

An additional object of the invention is to produce highly adhesive laminates between thin foils of lead or tin and thin plastic films.

Other objects and advantages of the present invention will be apparent in the light of the following detailed description of the invention which includes, by way of illustration, a description of the preferred and best mode that has been contemplated for carrying out the invention.

In general, the method of the present invention comprises providing the conductive metal layer, which is to be laminated, with a conversion coating. The metal layer or layers and the dielectric sheet or sheets are then loosely overlayed or superimposed with an interposed film or layer of an adhesive material and are subjected to a vacuum to remove all air or other gases from between the layers. While still under vacuum, the assembly of conductive and insulating layers, with interposed films of adhesive, are subject to heat and pressure to bond the layers.

Portions of the conductive layers are then removed, preferably by a photo-resist and etching technique, to form the desired conductive pattern.

The invention is especially useful in the laminating of thin plastic films and metal foils to produce flexible "printed circuits." In particular, the invention produces strongly adhesive bonding between thin foils of the soft metals, such as lead or tin, and thin films of plastic dielectric materials.

More in detail, the present invention comprises laminating metal and dielectric sheets, foils or films to produce multi-layer or laminated structures.

The metal sheet or foil may be formed of any metal or metal alloy having sufficient electrical conducitvity to meet the requirements of the finished "printed circuit." As previously noted, the invention has particular utility where the metal layer is composed of one of the soft metals, especially lead, tin or their alloys. However, the invention also has application to the production of laminates including copper, aluminum and other conductive metal layers.

The dielectric or insulating film or sheet may be composed of any non-conducting material, such as paper, plastic, glass and combinations thereof, as long as it is compatible with the laminating process and the environment in which the product is to be used. In general, however, the invention is particularly suited to use in the lamination of plastic sheets, such as Mylar, polyethylene, polypropylene, polyvinylidene chloride, cellulose acetate, polytetrafluoroethylene, etc.

The first principal step of the invention comprises furnishing the metal layer with a "conversion coating." "Conversion coating" is a term of art which is well understood in the chemical field and which refers to a coating which is formed by the chemical combination of the metal surface. This combination or reaction of the metal surface converts or transforms it to a compound of the metal.

Thus, for example, the anodic treatment of aluminum, lead, magnesium and other metals produces a "conversion coating" of the metal oxide. Other treatments with aqueous solutions by electrolytic or chemical methods will produce metal chromate, metal phosphate and other "conversion coatings" on the metal surface.

It has been found that the production of such a "conversion coating" on the surface of the metal before bonding greatly improves the adhesion of the metal to the dielectric layer.

In addition to improving adhesion of the metal to the plastic by means of the adhesive composition, the adhesion of the resist material, used in the etching process, to the metal is also greatly improved, if the exposed metal surface is also provided with a "conversion coating." Then, during etching, creeping of the etchant under the resist and the resulting inaccurate pattern delineation are inhibited.

The dielectric material may also be pre-treated, if necessary, to improve the adhesion of the material. Where, for example, the dielectric is a plastic sheet, it may be cleaned prior to bonding by washing with an aqueous solution of a strong alkali or chrome sulfuric acid.

An adhesive layer is then interposed between the insulating and conductive layers. This is usually accomplished by coating a layer or film of the adhesive on the insulating or metal layer. The adhesive preferably is a thermosetting resin composition, such as the phenol-formaldehyde, polyester or epoxy resin thermosetting adhesive compositions which are well known in the art.

While the invention may be used to build laminates containing any number of layers, the most common situation calls for the production of a laminate comprising three layers, an intermediate dielectric sheet sandwiched between two layers of electrically conductive metal. Assuming this to be the case in the present instance, the adhesive-coated insulating sheet is loosely placed between the two metal layers having conversion coatings on their surfaces. The loose assembly is then placed in the bottom of a vacuum device having upper and lower sections capable of being independently evacuated or pressurized.

The loose assembly is then subjected to evacuation simultaneously on both sides, so that all air is removed from between the layers. Then evacuation of the top section is terminated and atmospheric pressure is admitted, while evacuation of the bottom section is continued. This results in the layers being pressed closely together. A piston in the upper section of the vacuum device may also be employed to press the layers into intimate surface contact, further assuring the removal of air or other gases that may be entrapped between the layers.

Next, while still under vacuum, the assembly is transferred to a molding device and is subjected to heat and pressure to set the adhesive and securely bond the layers. The molding may conveniently be accomplished by pressing the assembly between the heated platens of a press.

After the molding operation is completed, portions of the metal layer are removed to define the desired conductive pattern. The selective removal of portions of the conductive metal layer is preferably accomplished by applying a photo-resist to the surface, exposing the resist through a negative of the desired conductive path, dissolving and removing the unexposed portions of the resist and etching the uncovered portions of the metal surface.

The laminated structure may then be subjected to further operations, such as through-hole formation and the attachment of contacts, to produce the completed "printed circuit."

The nature of the present invention will be more fully appreciated in the light of the following detailed example.

*Example*

The starting materials comprise two sheets of lead foil, six inches square, having a thickness of a fraction of a mil and a sheet of Mylar, also six inches square, having a thickness of about ⅛ mil.

The Mylar sheet was rinsed with a strong alkali solution, was then rinsed in water and was dried.

The surfaces of the foils of lead were provided with "conversion coatings." To accomplish this, the lead foils were anodized in an aqueous solution of trisodium phosphate at 6 volts for about one minute. The coated lead foils were then rinsed in water and were dried at 125° C. for about ½ hour.

A solution of a phenol-formaldehyde thermosetting resin adhesive in a volatile ethyl alcohol-tolerance mixture (1:1) was then sprayed onto both surfaces of the Mylar sheet. Upon drying, thin films of the thermosetting adhesive remained on both surfaces of the Mylar.

The Mylar was then loosely placed between the two lead foils and this loose assembly was placed in the lower section of a vacuum device having upper and lower sections which may be independently evacuated or pressurized. The upper and lower sections were closed over the assembly and both were subjected to a vacuum of about 100 microns to remove all air or other gases from between the layers of the assembly. Since both sides of the assembly are simultaneously subjected to the same strength vacuum, the layers remain loosely superimposed and easily permit the egress of entrapped gases.

The vacuum in the upper section only was then terminated and atmospheric pressure was admitted, so that the layers were pressed into intimate contact. The vacuum in the lower section of the device was continued during this time. A piston in the upper section was also pressed against the upper lead layer to assure firm contact between the layers.

While still under vacuum, the assembly was placed between the heated plates of a press and was subjected to 10,000 lbs. pressure, plus the pressure of the atmosphere on the vacuum, on the six square inch area. The temperature during the pressing step was 130° C., sufficient to set the phenol-formaldehyde thermosetting resin layers.

After pressure molding for about ½ hour, the assembly was brought to atmospheric pressure.

Next, both lead surfaces were coated with a commercially available photo-resist composition which was baked at 110° C. for ½ hour. The resist was then exposed to ultraviolet light through a negative of the desired conductive pattern. The unexposed portions of the resist were then removed with a solvent to expose the underlying lead layers.

The exposed lead was then removed by etching. Excellent results were obtained by etching with a solution of 5 gm. $NaBF_4$, 2.5 gm. $NH_2SO_3H$ and 10 cc. $H_2O_2$ (30%) in 50 cc. water.

The "printed circuit" thus produced was then ready for the final finishing steps, such as through-hole formation or contact attachment.

The product was a thin, flexible, strongly bonded laminate, free from entrapped bubbles of air and eminently suited for use as a component in cryogenic devices.

While the present invention has been described in relation to certain preferred embodiments and has been illustrated by specific examples, it will be obvious to those skilled in the art that many modifications may be made in the method without departing from the spirit of the invention as defined in the following claims.

What is claimed is:

1. A method for producing strongly bonded, bubble-free laminates for use as printed circuit boards consisting of at least one layer of a resinous plastic dielectric material and at least one layer of an electrically conducting metal comprising, (a) anodizing at least one surface of a sheet of metal to form a "conversion coating" on said surface of said metal;

(b) coating at least one surface of said layer of plastic dielectric material with a film of thermosetting adhesive;

(c) loosely superimposing said sheet of metal and said layer of plastic dielectric material so that said "conversion coating" and said film of thermosetting adhesive are in contact to form an assembly;

(d) subjecting both sides of said assembly to vacuums of about 100 microns to remove all gases entrapped between the layers of said assembly;

(e) terminating the vacuum in the upper section so that the layers are pressed into intimate contact;

(f) subjecting said assembly to a temperature of about 130° C., and a pressure of about 10,000 lbs., while still under vacuum, to set said thermosetting adhesive, masking said metal sheet, and (g) etching to remove selected portions of said sheet of metal to define an electrically conductive path.

2. The method of claim 1 wherein the metal is lead and the etchant solution is $NaBF_4$, $NH_2SO_3H$ and $H_2O_2$.

3. The method of claim 1 wherein the plastic layer is polyethylene terephthalate and the adhesive is a phenolic resin.

References Cited by the Examiner

UNITED STATES PATENTS

| | | | |
|---|---|---|---|
| 2,932,599 | 4/1960 | Dahlgren. | |
| 3,042,574 | 7/1962 | Hochberg | 156—286 |

JACOB H. STEINBERG, *Primary Examiner.*